(12) United States Patent
Bhattacharya et al.

(10) Patent No.: US 8,650,518 B2
(45) Date of Patent: Feb. 11, 2014

(54) METHOD AND APPARATUS FOR RULE-BASED AUTOMATIC LAYOUT PARASITIC EXTRACTION IN A MULTI-TECHNOLOGY ENVIRONMENT

(75) Inventors: Utpal Bhattacharya, Noida (IN); Sanjay Gupta, Noida (IN); Tarun Beri, Noida (IN); Mohd Vaseem, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 655 days.

(21) Appl. No.: 12/684,157

(22) Filed: Jan. 8, 2010

(65) Prior Publication Data

US 2011/0173582 A1 Jul. 14, 2011

(51) Int. Cl.
*G06F 17/50* (2006.01)
(52) U.S. Cl.
USPC .......................................... 716/106; 716/107

(58) Field of Classification Search
USPC .................................................. 716/105–110
See application file for complete search history.

(56) References Cited

U.S. PATENT DOCUMENTS

| | | | |
|---|---|---|---|
| 2002/0104063 A1* | 8/2002 | Chang et al. | 716/4 |
| 2003/0208741 A1* | 11/2003 | Ono | 716/21 |
| 2004/0194047 A1* | 9/2004 | Matsubara | 716/11 |
| 2006/0277506 A1* | 12/2006 | Stine et al. | 716/4 |
| 2007/0027569 A1* | 2/2007 | Naya et al. | 700/121 |

* cited by examiner

*Primary Examiner* — Binh Tat
(74) *Attorney, Agent, or Firm* — Holland & Knight LLP; Mark H. Whittenberger, Esq (57) ABSTRACT

A system for extracting a layout from an object in a fabric includes means for providing fabric data to a rule-based layout extraction engine; means for maintaining a layout extraction rule to select a layout object from the fabric data; means for maintaining a binding rule to bind the layout object to a solver; means for maintaining a boundary rule to specify a boundary condition for a solver; and means for executing the solver on the layout object to generate a model of the object.

20 Claims, 8 Drawing Sheets

METHOD AND APPARATUS FOR RULE-BASED AUTOMATIC LAYOUT PARASITIC EXTRACTION IN A MULTI-TECHNOLOGY ENVIRONMENT

BACKGROUND OF THE INVENTION

1. Field of the Invention

The embodiments of the invention relate to circuit design and more particularly to simulating models of parasitic effects in technologies which span multiple fabrics. Although embodiments of the invention are suitable for a wide scope of applications, it is particularly suitable for automatically, under the guidance of user-defined rules, extracting layout objects from a layout spanning multiple fabrics, recognizing custom design patterns in the layout, binding the layout objects to specialized solvers to generate models of parasitic effects, and simulating combinations of the models arising from layout objects which span multiple fabrics.

2. Discussion of the Related Art

In general, an electronic system include a plurality of integrated circuit chips (IC) for performing various electronic functions. Each IC includes many electronic components (e.g. transistors, diodes, inductors, capacitors, inverters, logic gates, multiplexers, etc.) interconnected in a prescribed manner to respond to input electrical signals and produce other electrical signals according to the desired electronic function performed by the IC. The electronic system may also include one or more package and one or more board, such as a printed circuit board (PCB). Each of the die, the board and the package constitutes a fabric for exchanging electrical signals between the various electrical components.

The electronic components or objects in the electronic system are interconnected with signal paths that carry electrical signals into and out of an IC die through a package substrate to the package input/output connectors across the multiple fabrics. The signal path traverses multiple fabrics through package balls, wirebonds, vias to interconnect the electronic components.

Figure 1:
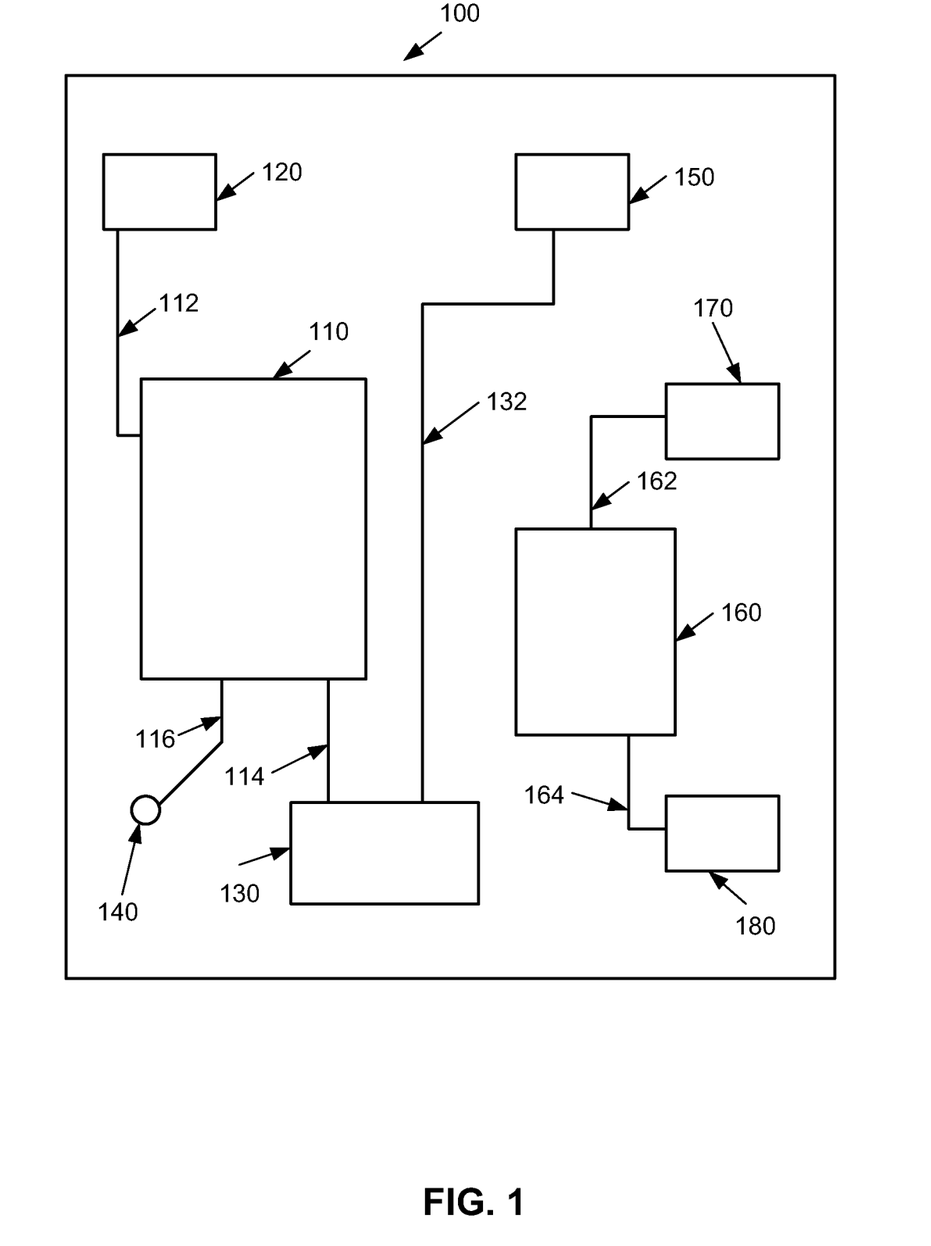
FIG. 1 shows a block diagram of an RF system according to the related art.

FIG. 1 shows a block diagram of an RF system according to the related art. Referring to FIG. 1, a RF system 100 includes a microprocessing unit 110. The microprocessing unit 110 may be provided in a die. The microprocessing unit 110 may be connected to one or more capacitor 120 provided on a board, such as a PCB board via one or more wirebond 112. The microprocessing unit 110 may also be connected to additional electrical elements through a via 140. The interconnection from the microprocessing unit 110 to the via 140 may include a RF path 116. The microprocessing unit 110 may also be connected to a rectangular inductor 130 on the PCB. The rectangular inductor 130 may itself be connected to a capacitor 150 via a transmission line 132.

The related art RF system of FIG. 1 also includes a RF coupler 160 provided on the PCB. The RF coupler 160 is connected to a capacitor 170 via an interconnection 162. The RF coupler 160 is also connected to an inductor 180 on the PCB via an interconnection 164.

The design of an electronic system, such as the RF system 100 of FIG. 1, may involve multiple phases with particular requirements. For example, during an exploration phase, the designer of an electronic system may use quick design tools to obtain initial models for an RF signal path, such as RF path 116. The designer may use more accurate but slower design tools to refine the initial models or obtain more accurate models at a verification phase. Moreover, a design team may prefer to use one or more specific solver to model specific physical structures in an electronic system.

There are many tools targeted to verification of circuits, but there is a tradeoff between specialized tools targeted towards verification of specific elements of circuits and general tools targeted towards verification of a broader range of elements and entire circuits. Verification tools addressing entire circuits are often ill-suited to the verification of specialized components of a circuit. For example, a circuit verification tool may be both inaccurate and slower than a more specialized verification tool when faced with a specialized component.

These structures cannot all be modeled optimally with a single electromagnetic field solver, but specialized solvers exist which are capable of modeling these specific structures more quickly or with greater accuracy. For example, a specialized wirebond solver may be required for accurately modeling the behavior of the interconnection between the microprocessing unit 110, the capacitor 120 and the wirebond interconnection 112. Similarly, a specialized RF solver may be required to model the behavior of the interconnection from the microprocessing unit 110 through the via 140. Moreover, the designer may want to use a customized algorithm for modeling the transmission line 130 between the rectangular inductor 130 and the capacitor 150.

A portion of the layout for an electronic system need be extracted to use specialized solvers for particular elements of the electronic system. For instance, to use a specialized wirebond solver for portion of the RF system 100 of FIG. 1, a designer needs extract the layout of the wirebond portion of the RF system 100 including the microprocessing unit 110 from the corresponding die, the capacitor 120 from the PCB and the wirebond interconnection 112. Similarly, to use a specialized RF solver for the RF path from the RF system 100, the designer needs to extract the layout of the elements interconnected by the RF path including the microprocessing unit 110, the via 140 and the connector 116. To use a customized algorithm for modeling the transmission line 132, the designer needs extract the layout of the elements of the RF system 100 that are interconnected by the T-line 132 including the rectangular inductor 130 and the capacitor 150.

Simulation of behaviors of a circuit may be done using models created by solvers. If various pieces of a circuit were solved by different solvers, the models must be combined to simulate behaviors of portions of the circuit which encompass pieces modeled by different solvers. However, each solver may have its own format, and each simulator may also have its own format.

According to the related art, models generated by different solvers are combined or stitched manually to provide the output of a modeled component to the input of another modeled component, and imported into a simulator or simulation test bench. However, manual stitching of models is error prone.

Moreover, the models generated by the solvers are generally in one or more standard formats. However, the input to individual solvers may be in various formats. The manual translation of a solver's output in a format compatible with another solver's input is time-consuming and also error prone.

Furthermore, changes made to the layout in one or more of the fabrics require rerunning the extraction process, which is also time-consuming and error prone in a manual environment because of the many combinations of models required for the simulator or simulation test bench.

Circuits which are embedded in multiple fabrics present additional challenges to verification and simulation. Specialized tools may be able to extract and solve objects from any single fabric, but there is a need to extract objects from multiple fabrics, create models of objects which span multiple fabrics, and to simulate behaviors of circuits such as RF circuits which span multiple fabrics. There may also be instances where the layout objects spanning multiple fabrics may be designed with a specific geometry, and it would be desirable to recognize those geometries for potential use with specialized solvers targeted towards objects with those geometries. The current approach used to solve signal paths which pass through multiple fabrics is to manually identify special geometries from the multiple fabrics and to generate models for simulation which are stitched together manually for use in simulation.

SUMMARY OF THE INVENTION

Accordingly, embodiments of the invention are directed to a method and apparatus for rule-based automatic layout parasitic extraction in a multi-technology environment that substantially obviates one or more of the problems due to limitations and disadvantages of the related art.

An object of embodiments of the invention is to provide a method for automatically extracting layout objects in a multi-technology environment based on a specified extraction rule.

Another object of embodiments of the invention is to provide a method for binding layout objects to corresponding solvers based on a specified binding rule.

A further object of embodiments of the invention is to provide a design environment capable of comparing multiple layouts using a test bench and to update a layout based upon the results.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, a system for extracting a layout from an object in a fabric includes means for providing fabric data to a rule-based layout extraction engine; means for maintaining a layout extraction rule to select a layout object from the fabric data; means for maintaining a binding rule to bind the layout object to a solver; means for maintaining a boundary rule to specify a boundary condition for a solver; and means for executing the solver on the layout object to generate a model of the object.

In another aspect, a method for extracting a layout from an object in a fabric includes providing fabric data to a rule-based layout extraction engine; selecting a layout object from the fabric data based upon a layout extraction rule; binding the layout object to a solver based upon a binding rule; specifying a boundary condition for a solver based upon a boundary rule; and executing the solver on the layout object to generate a model of the object.

In another aspect, a computer program product includes a computer readable medium, the computer readable medium including instructions which, when executed by a processor, causes the processor to execute a process for extracting a layout from an object in a fabric, the process including providing fabric data to a rule-based layout extraction engine; selecting a layout object from the fabric data based upon a layout extraction rule; binding the layout object to a solver based upon a binding rule; specifying a boundary condition for a solver based upon a boundary rule; and executing the solver on the layout object to generate a model of the object.

In another aspect, a computer readable medium is provided for storing a set of instructions which, when executed by a computer processing system, causes the computer processing system to process input data representing the layout of an electronic circuit to extract one or more object from the layout for binding with a corresponding binding solver; the set of instructions includes selecting a first object from the layout, applying at least one of a plurality of layout extraction rules relating the first object to a second object from the layout, the layout extraction rules including a proximity rule, a cross-fabric rule, an extended net rule, a via rule, a pruning rule, and a pattern matching rule, extracting the first and second objects from the layout in accordance with the applied layout extraction rule, and binding the extracted first and second objects to a solver in accordance with the applied layout extraction rule to generate a model of the interconnection between the first and second objects.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION OF THE PREFERRED EMBODIMENTS

Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 2:
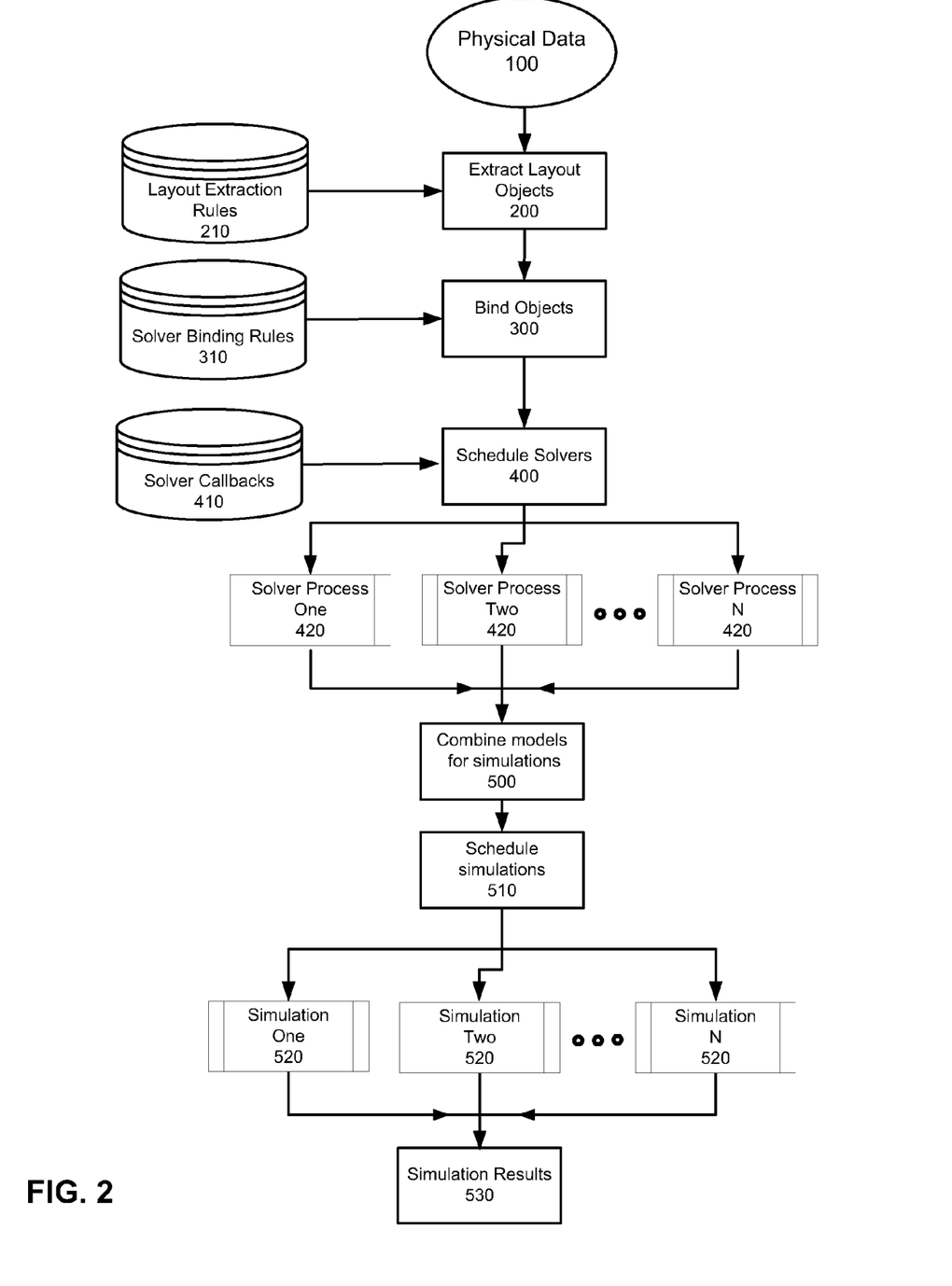
FIG. 2 shows an exemplary flow chart illustrating a method for automatically integrating multiple layouts for multiple technologies across multiple fabrics according to an embodiment of the invention.

FIG. 2 shows an exemplary flow chart illustrating a method for automatically integrating multiple layouts for multiple technologies across multiple fabrics according to an embodiment of the invention. Referring to FIG. 2, the process is provided with physical data 100 corresponding to one or more layout including electronic devices or components interconnected in a prescribed manner across one or more fabric to form an electronic circuit. The electronic devices or components may include inductors, capacitors, etc. The electronic devices are interconnected to form various circuits, such as radio frequency (RF) circuits, integrated circuits (ICs), printed circuit boards (PCBs), and system-in-packages (SiPs). The electronic devices are interconnected through signal paths having various shapes including, for example, connecting lines, vias, wirebonds and package balls.

In an embodiment, the physical data 100 may include the physical layout of a SiP. In another embodiment, the physical layout includes an IC layout representing a circuit like a wireless LAN (WLAN) device.

The physical data 100 may be provided in different formats for layouts embedded in different fabrics. In a system design involving multiple fabrics, the physical data can be converted to a common intermediate format. In an embodiment, the physical data 100 is converted to a format readable by one or more design tool to be used in the design of the electronic circuit.

At block 200, layout objects are extracted from the physical data 100 based on user-defined layout extraction rules 210. A layout object may represent a physical element, such as a package ball, wirebond, via, RF element, capacitor, etc. A layout object may include a pattern like a meander line, a shape like a spiral inductor shape, or electronic components such as interdigital capacitors, bond fingers, etc. One or more of the layout objects may require special processing, for example, solving a corresponding electromagnetic or electrostatic field equation. A user may manually enter one or more of the layout extraction rules 210 to guide the layout extraction at block 200.

The layout objects extracted at block 200 are bound at block 300 to corresponding solvers using user-defined solver binding rules 310. Each of the solvers creates models, for example for the parasitic effects, of the extracted layout objects. For example, a wirebond layout object might be bound to a 3D electromagnetic solver to calculate a model of the wirebond's parasitic effects.

In an embodiment, one or more of the layout objects is bound to one or more solver automatically using user-defined binding rules. In other embodiments, the user can bind one or more of the layout objects manually to one or more specific solver. In still another embodiment, one or more first layout object can be automatically bound to corresponding solvers to proceed either automatically or manually at the choice of the user, thus allowing for different choices depending upon the needs of the situation.

After the binding of the layout objects, the corresponding solvers are scheduled at block 400 based on solver callbacks specified at block 410. The solver callbacks at block 410 call the appropriate solvers to create models of the extracted layout objects.

The scheduling of the solvers at block 400 is controlled based on available resources. For example, in a multi-process environment as shown in FIG. 2, the solver callbacks of block 410 can be scheduled to be performed in parallel by invoking a plurality of solver processes 420. In another example, solver callbacks of block 410 can be scheduled to be performed serially by invoking a single solver process 420.

The scheduling of the solvers at block 400 can also be based on user-defined priority rules. In an embodiment, solver callbacks at block 410 are performed automatically. Then, absent user-defined priority rules defining an specific ordering for calling the solvers, solvers with the same priority level are scheduled based upon the order of the input data. In another embodiment, a user can manually enforce a particular ordering for performing the solver callbacks at block 410. In other embodiments, the user may choose whether calls of solvers occur automatically or with user guidance, depending upon the user's needs at that particular moment.

A scheduled solver callback at block 410 launches a corresponding solver process 420 includes to create models of the extracted layout objects. The solver process 420 returns the created model for the layout object to the corresponding solver callback process 410. When execution returns from the solver process 420 to the solver callback 410, the server callback 410 frees the available resources to be reallocated to other solver processes 420 creating a framework for forking the solver and for technology stack up. Examples of callback include SKILL procedures and C/C++ functions loaded through a shared library. In an embodiment, the solver callbacks 410 are provided in a database. Then, a table is provided for looking a corresponding function name for the solver callback 410 during the scheduling process at block 400.

The solvers also make use of user-defined boundary rules. Each solver may have its own format for objects. Therefore, a call to a solver on a layout object will entail a conversion of the layout object to a format compatible with that solver if the format is not identical to the format of the layout object in the physical data.

The models generated by the one or more solver process 420 are combined with other models at block 500. Each solver process 420 may generate one or more type of models, e.g. S-parameter model type, for the extracted layout objects. Moreover, the extracted layout object may include an RF transmission line element having a specific shape, such as a meander line (MLIN) or a bending line (BEND), depending on the routing topology. The solver process 420 combines the generated models in accordance with the types of the generated models and the shapes of the extracted layout objects for binding with the appropriate solver, such as SPICE using an appropriate format for the solver, e,g. XML. The combination of the generated models at block 500 may include stitching across interfaces to provide the output of the model of one object to the input of the model of another object.

After the combination of the models at block 500, one or more simulation is scheduled for the combined models at block 510. As shown in FIG. 2, the scheduling of the simulations at block 510 may includes invoking a plurality of simulation processes 520 to be performed in parallel. Assignment of simulations to simulation processes 520 may be done via standard operating system calls.

The results from the simulation process are provided at block 530. Each simulation result at block 530 represents the behavior of one or more layout object or of the entire circuit. For example, a simulation process 520 may calculate the gain of an RF amplifier. Another simulation process 520 may calculate the insertion loss of a T/R switch.

In an embodiment of the invention, the simulation processes 510 can be provided to the solver integration environment in a user-defined table that maps each of the simulation processes 510 to a corresponding conversion function for converting a combination of models of parasitic effects to a compatible format for the simulation process 510.

In an embodiment of the invention, the simulation processes 510 provided in the user-defined table are automatically called and the corresponding simulation is performed on the models generated by the solver processes at block 420. In another embodiment, the user can specify a test bench involving one or more of the simulation processes 510, and the specified one or more of the simulation processes 510 is automatically performed on the models generated from the physical data 100. In another embodiment of the invention, the user controls which simulations and when to launch the simulation. In another embodiment of the invention, the user chooses whether the simulations are performed automatically or whether the user guides the creation of simulations.

According to an exemplary embodiment of the invention, the physical data 100 in FIG. 2 may correspond to a layout for an electronic circuit spanning multiple fabric technologies in an OpenAccess database format. The OpenAccess format provides an object-based, e.g. C++, application programming interface for the IC design data, which allows a user to incorporate design tools and data from multiple sources. The OpenAccess format provides a standard model for describing data to be exchanged between the various electronic design tools and an interface for invoking software modules across various electronic design automation tools.

During extraction of the layout objects at block 200, the process determines the type of fabric underlying the particular layout object, calls the appropriate extraction tool to extract layout objects from that fabric, and selects the appropriate layout extraction rules to guide the extraction process. Layout objects are extracted automatically by processing the user-defined extraction rules, in an order defined by the user, and the layout objects are automatically bound to appropriate electromagnetic field solvers according to the user-defined binding rules. Scheduling of the solver callbacks is also done automatically using user-defined precedence rules, with callbacks assigned to each solver. The models of parasitic effects created by the solvers are automatically combined and a suite of test bench simulations are automatically performed, resulting in a process guided by user-defined rules which is entirely automated from layout object extraction through performing the suite of test bench simulations.

According to another exemplary embodiment of the invention, the physical data 100 in FIG. 2 may correspond to a layout for an electronic circuit involving a single fabric. Thus, extraction of the layout objects at block 200 may target the particular fabric involved. Extraction of layout objects, binding of those objects to solvers, scheduling of the solvers to create models, and simulation of combinations of those models are all performed automatically based on the user-defined extraction rules, the order defined by the user, and according to the user-defined binding rules.

According to yet another exemplary embodiment of the invention, the physical data 100 may correspond to a layout for an electronic circuit spanning multiple fabric technologies. One or more of the processing steps may be manually controlled by the user in accordance with user-defined rules. For example, the user may choose to apply a specific layout extraction rule 210 to select particular layout objects. Moreover, the user may also specify particular solver callbacks to be scheduled so that the extracted objects be bound to the specified solver callbacks 410. Furthermore, the user can choose which a specific combination of the extracted models for simulation and manually launch the specified simulations manually.

Figure 3:
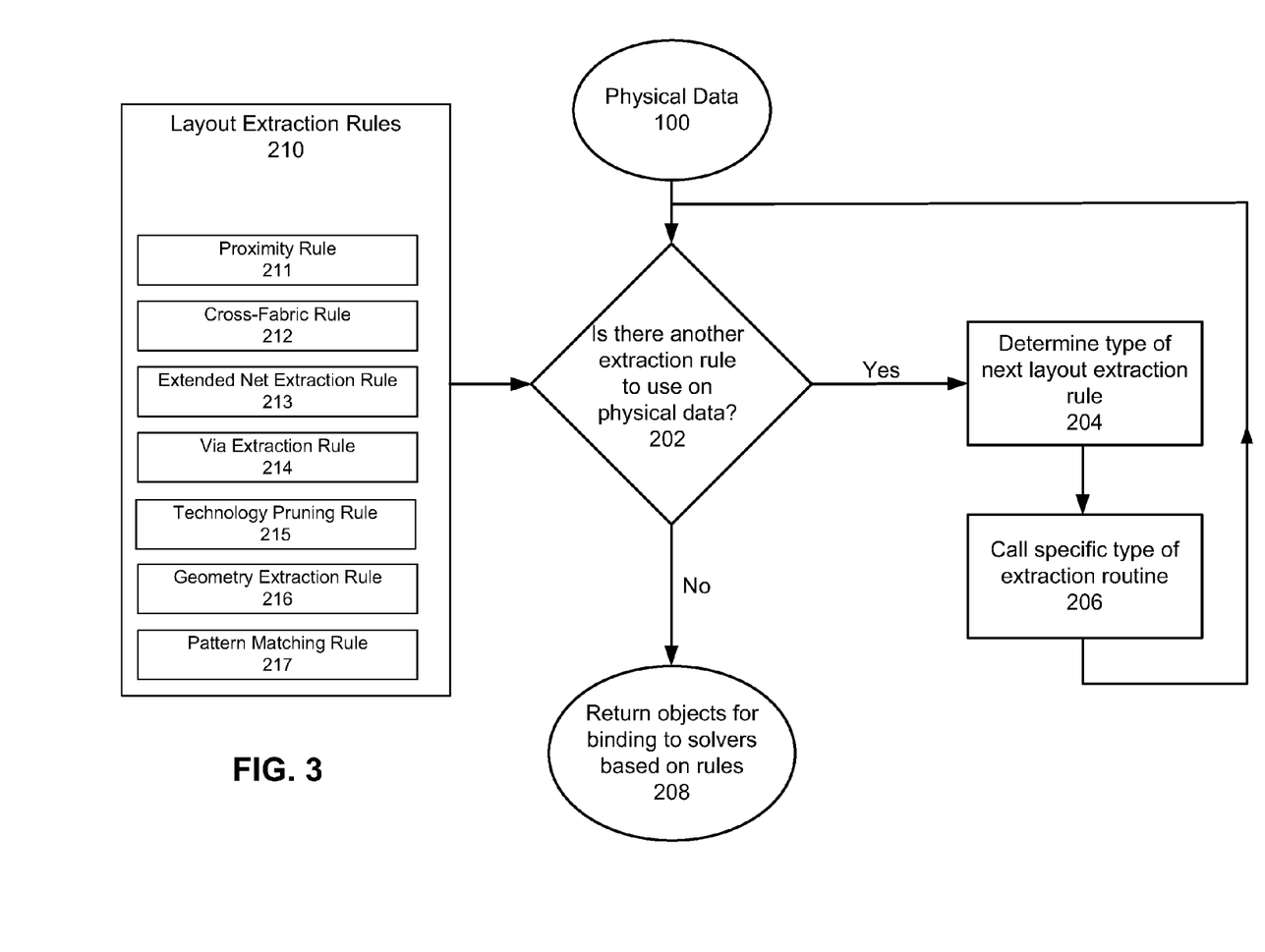
FIG. 3 shows an exemplary flow chart illustrating a process for extracting objects from a layout according to an embodiment of the invention.

FIG. 3 shows an exemplary flow chart illustrating a process for extracting objects from a layout according to an embodiment of the invention. Referring to FIG. 3, the extraction of layout at block 200 of FIG. 2 is based on layout extraction rules 210 provided in a database. For each selected layout object from the physical data 100, the process determines at 202 whether there is one or more corresponding extraction rule 210 for the selected object. Then, the process determine at block 204 the type of the corresponding one or more layout extraction rule 210. Then, the process calls a specific layout extraction routine at block 206 to extract one or more object in accordance with the specified one or more extraction rule 210. When all the extraction rules 210 corresponding to the physical data 100 have been applied at 208, the layout extraction process at block 200 of FIG. 2 returns the extracted objects to be bound by the binding process at block 300 of FIG. 2.

The layout extraction rules 210 may include, for example, one or more proximity rule 211, one or more cross-fabric extraction rule 212, one or more extended net extraction rule 213, one or more via extraction rule 214, one or more technology extraction rule 215, and one or more geometry extraction rule 216. Pattern matching rules 217 may also be provided to be associated with the one or more geometry extraction rule 216.

A proximity extraction rule 211 may specify that layout objects be selected based upon how their proximity other layout objects. For example, a proximity extraction rule 211 may include a coupling coefficient depending on an input frequency. Thus, during layout object extraction at block 200 of FIG. 2, according to the proximity extraction rule 211 for the selected object, a range is calculated based upon the coupling coefficient and all objects falling within that range in a three-dimensional layout space are extracted.

A cross-fabric extraction rule 212 may specify that layout objects in a fabric be selected based upon their interconnection with one or more other layout object in another fabric. When an object is selected during layout object extraction, the cross-fabric extraction rule 212 applicable to the selected object may require, for example, that all metallic objects of a specified type connected to the layout object in another fabric be also extracted. For example, a cross-fabric extraction rule 212 may require that, for a given net in an interface connected to a fabric, all metallic objects connected to the interface in one or more other fabric.

Thus, according to an embodiment of the invention, a cross-fabric extraction rule 212 may require the selection of devices connected to a layout object. Another cross-fabric extraction rule 212 may require selection of ports connected to a layout object. Yet another cross-fabric extraction rule 212 may select only specific metal layers encountered in another fabric. Still another cross-fabric extraction rule 212 may select any metallic object connected to a layout object in a particular fabric.

Figure 4:
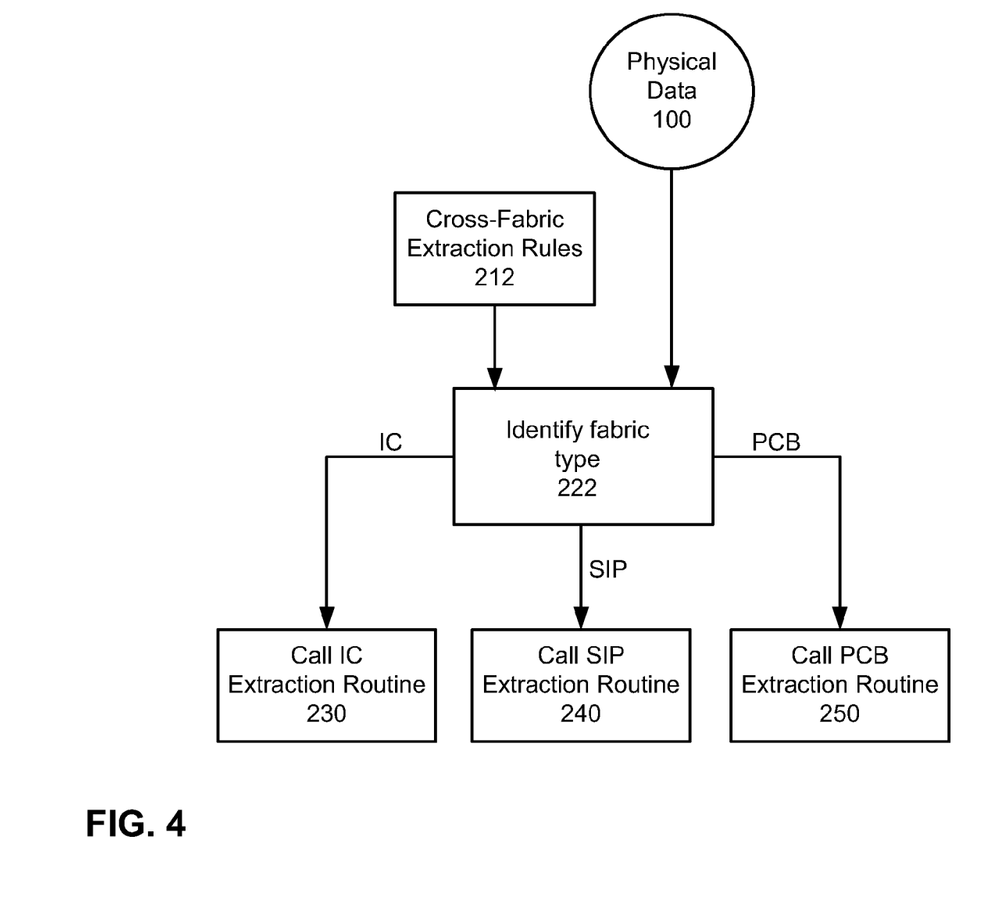
FIG. 4 shows an exemplary flow chart illustrating a process for extracting objects from a layout spanning multiple fabrics according to an embodiment of the invention.

FIG. 4 shows an exemplary flow chart illustrating a process for extracting objects from a layout spanning multiple fabrics according to an embodiment of the invention. Referring to FIG. 4, the layout extraction routine at block 206 of FIG. 3 processes the physical data 100 to extract one or more object across multiple fabrics in accordance with the corresponding cross-fabric extraction rule 212. The layout extraction routine 206 identifies the type of each of the fabrics at block 222 to determine an appropriate specialized extraction routine to perform the required extraction. If the parent fabric is an integrated circuit (IC), the layout extraction routine 206 calls a specialized IC extraction routine at block 230 to apply the appropriate cross-fabric rule 212 to the layout object. If the parent fabric is a system-in-package (SiP), the layout extraction routine 206 calls a specialized SiP extraction routine at block 240 to apply the appropriate cross-fabric rule 212 to the layout object. If the parent fabric is a printed circuit board (PCB), the layout extraction routine 206 calls a specialized IC extraction routine at block 250 to apply the appropriate cross-fabric rule 212 to the layout object.

An extended net extraction rule 213 specifies that multiple layout objects be selected if the layout objects are part of the same extended net according to the extended net extraction rule 213. During layout object extraction, if an object in a layout is selected and the rule is an extended net extraction rule 213, all objects within the same extended net are extracted and returned to the calling routine. For example, Pcells or embedded passive components can belong to the same extended net as a layout object. As another example, connected shapes or c-lines in a layer might be extracted according to the extended net extraction rule 213 to be modeled together by a solver.

A via extraction rule 214 determines how objects connected through a via be processed by the extraction routine. For example, the via extraction routine 214 may specify that the via be extracted as an individual element. The via extraction routine 214 may also specify that the associated tracks and/or shape be extracted as a single layout entity to be sent together to the appropriate solver.

According to an embodiment of the invention, a technology pruning rule 215 may be provided to combine a plurality of technologies across multiple fabrics into a single technology. For example, if an object in an IC and another object from an SiP are selected, a combined technology can be generated in accordance with the technology pruning rule 215. The technology pruning rule 215 may also specify additional details, e.g. additional layers to be pruned. Accordingly, the technology pruning rule 215 may simplify the layout objects which are bound to solvers, particularly in the case of stacked dies.

Figure 5:
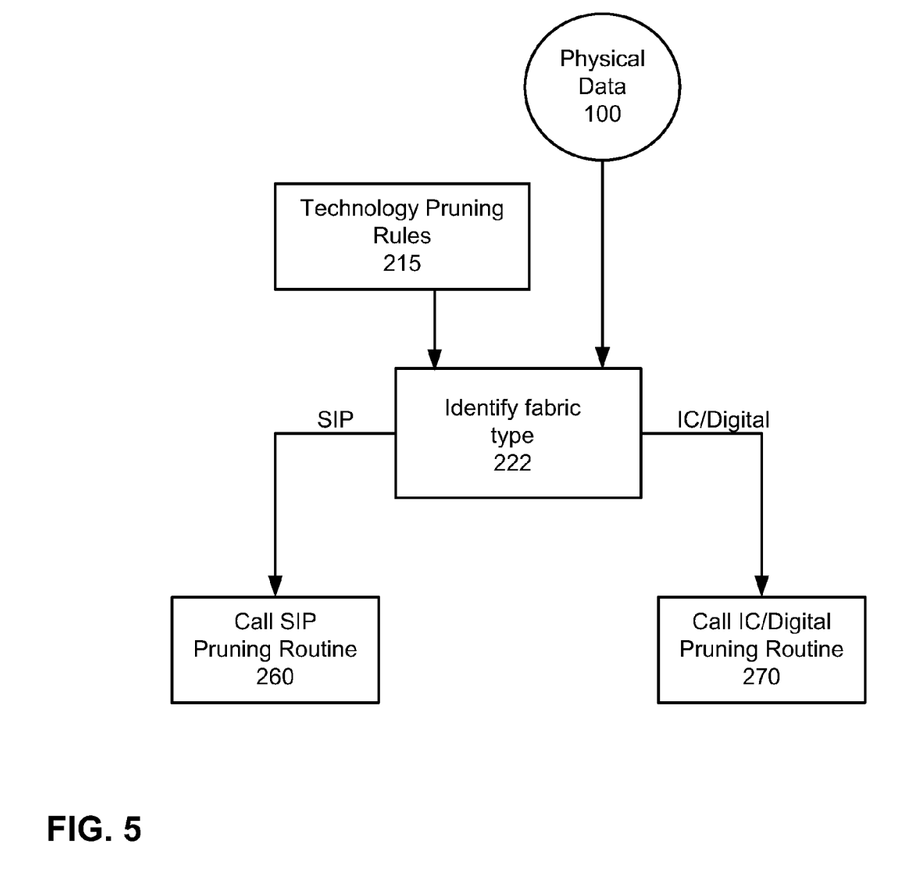
FIG. 5 shows an exemplary flow chart illustrating a process for pruning technology from a layout spanning multiple fabrics according to an embodiment of the invention.

FIG. 5 shows an exemplary flow chart illustrating a process for pruning technology from a layout spanning multiple fabrics according to an embodiment of the invention. Referring to FIG. 5, the layout extraction routine at block 206 of FIG. 3 processes the physical data 100 to prune one or more technology from multiple fabrics in accordance with technology pruning rules 215. The layout extraction routine at block 206 iterates over all of the fabrics in the layout, starting from the bottom of the layout. The layout extraction routine 206 identifies the type of each of the fabrics in the iteration at block 222 to determine an appropriate specialized technology pruning routine to perform the required pruning on the current fabric to be processed. If the current fabric is a system-in-package (SiP), the layout extraction routine 206 calls a specialized SiP technology pruning routine at block 260 to prune the IC/Digital fabric in accordance with the appropriate technology pruning rule 215. If the current fabric is an integrated circuit or a digital fabric (IC/Digital), the layout extraction routine 206 calls a specialized IC/Digital technology pruning routine at block 270 to prune the IC/Digital fabric in accordance with the appropriate technology pruning rule 215.

In an embodiment, the specialized SiP technology pruning routine at block 260 transfers all layers on the SiP to a multi-technology file. The specialized SiP technology pruning routine at block 260 also provides for each layer in the multi-technology file an elevation relative to a base layer.

In an embodiment, the specialized IC/Digital technology pruning routine at block 270 processes each layer in the current fabric to determine the elevation of the layer relative to the base layout. The specialized IC/Digital technology pruning routine at block 270 also computes the height or thickness of each layer.

If the current layer intersects a previously transferred layer, the specialized IC/Digital technology pruning routine at block 270 remove all the previously transferred layers from the multi-technology file. Then, the specialized IC/Digital technology pruning routine at block 270 disregards the current fabric because it is not a stacked fabric.

Otherwise, if the current layer does not intersect any previously transferred layer, the specialized IC/Digital technology pruning routine at block 270 transfers the current layer to the multi-technology file.

According to an embodiment of the invention, a geometry extraction rule 216 is provided to select groups of layout objects matching a specified geometric arrangement based upon pattern matching algorithms. A geometry extraction rule includes a geometry name and one or more of a callback to a function to determine whether the layout object matches a pattern, and a database entry corresponding to the pattern. If the geometry extraction rule contains a callback function, the function is called upon the layout object and a token indicating a match or not a match is returned. If a match is found, the layout object is associated with the geometry name and returned. If no match is found, the layout object is returned without an associated geometry.

If the geometry extraction rule contains a database entry corresponding to a pattern, a point by point shape transformation and comparison is used to determine if the pattern matches the database entry. If the geometry of the layout object matches the pattern, the layout object is associated with the geometry name of the extraction rule returned, otherwise the layout object is returned without an associated geometry.

Geometric pattern matching can identify special elements like inductors or meander lines. In some embodiment of the invention, rules containing callbacks for several pre-defined shapes are included in the embodiment and thus recognizable without any intervention by the user. In an embodiment of the invention, these callbacks identify inductors, meander lines, and coplanar wave guides realized through connect lines or shapes. In other embodiments of the invention, the user defines database entries for geometric patterns and/or develops his own pattern-recognizing function to recognize any pattern the user desires, and then defines a rule referencing that database entry or a callback to that function. In another embodiment of the invention, default geometry extraction rules exist which can identify certain patterns such as meander lines, inductors, and co-planar wave guides, but which can be supplemented and/or overridden by user-defined geometry extraction rules.

Figure 6:
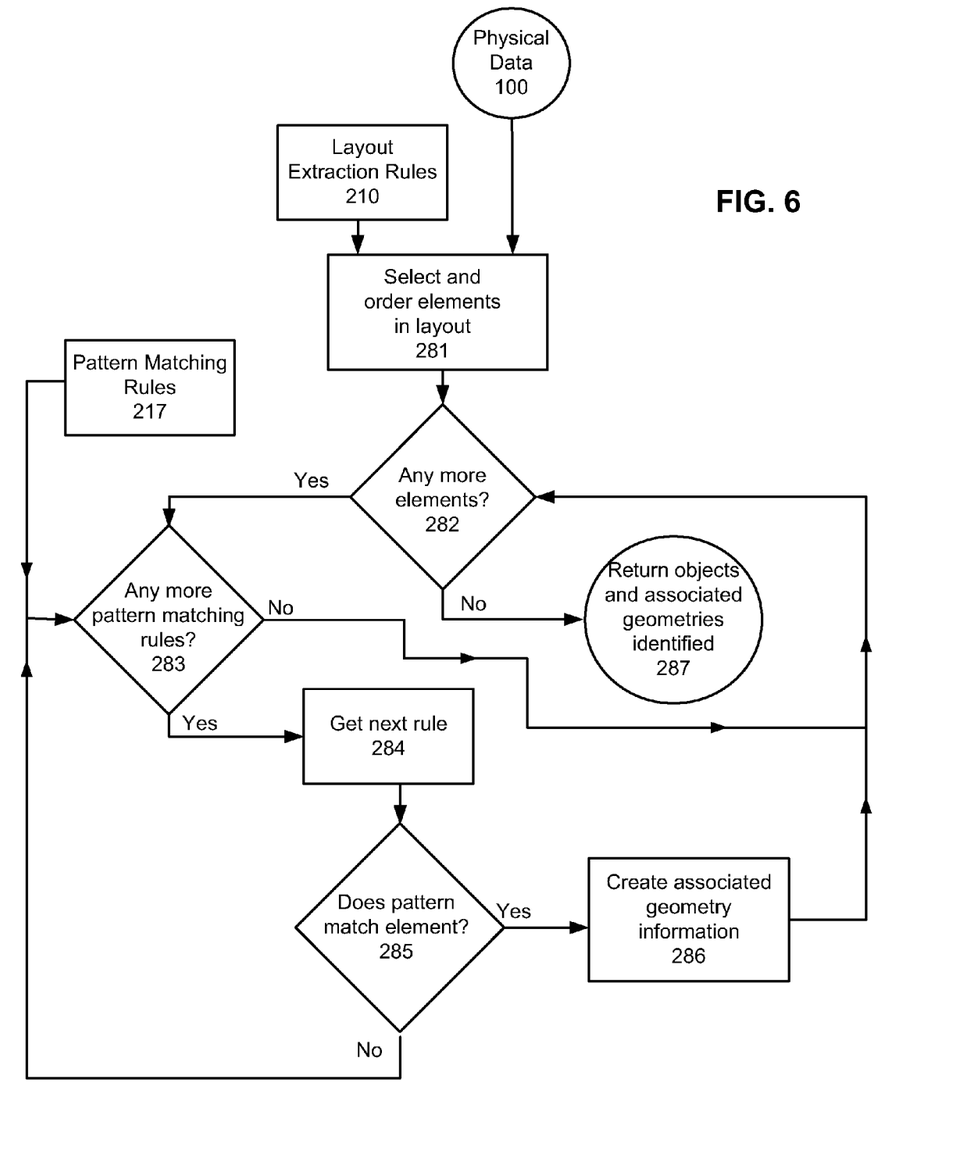
FIG. 6 shows an exemplary flow chart illustrating a process for extracting geometries of elements of a layout according to an embodiment of the invention.

FIG. 6 shows an exemplary flow chart illustrating a process for extracting geometries of elements of a layout according to an embodiment of the invention. Referring to FIG. 6, physical data 100 representing a layout object is analyzed using one or more of the layout extraction rules 210, e.g. one or more of layout extraction rules 211-215 to obtain layout elements 261. For each element, the pattern matching rules 217 are tried sequentially at 284 until a match is found at 285, in which case a geometry is associated with that element at 286. After processing all layout objects from the physical data 100, the selected objects and their associated geometries are returned at 287. If no pattern matching rule matches a layout object, no geometry is associated with that object.

In another embodiment of the invention, each pattern matching rule is tried sequentially upon all of the objects, and all object and geometry associations are returned. In another embodiment of the invention, each pattern matching rule is tried sequentially upon all the objects that have not yet been associated with a geometry, and objects and their associated geometries are returned.

An extracted layout object is bound to one or more solvers to model the parasitic effects of that layout object.

Figure 7:
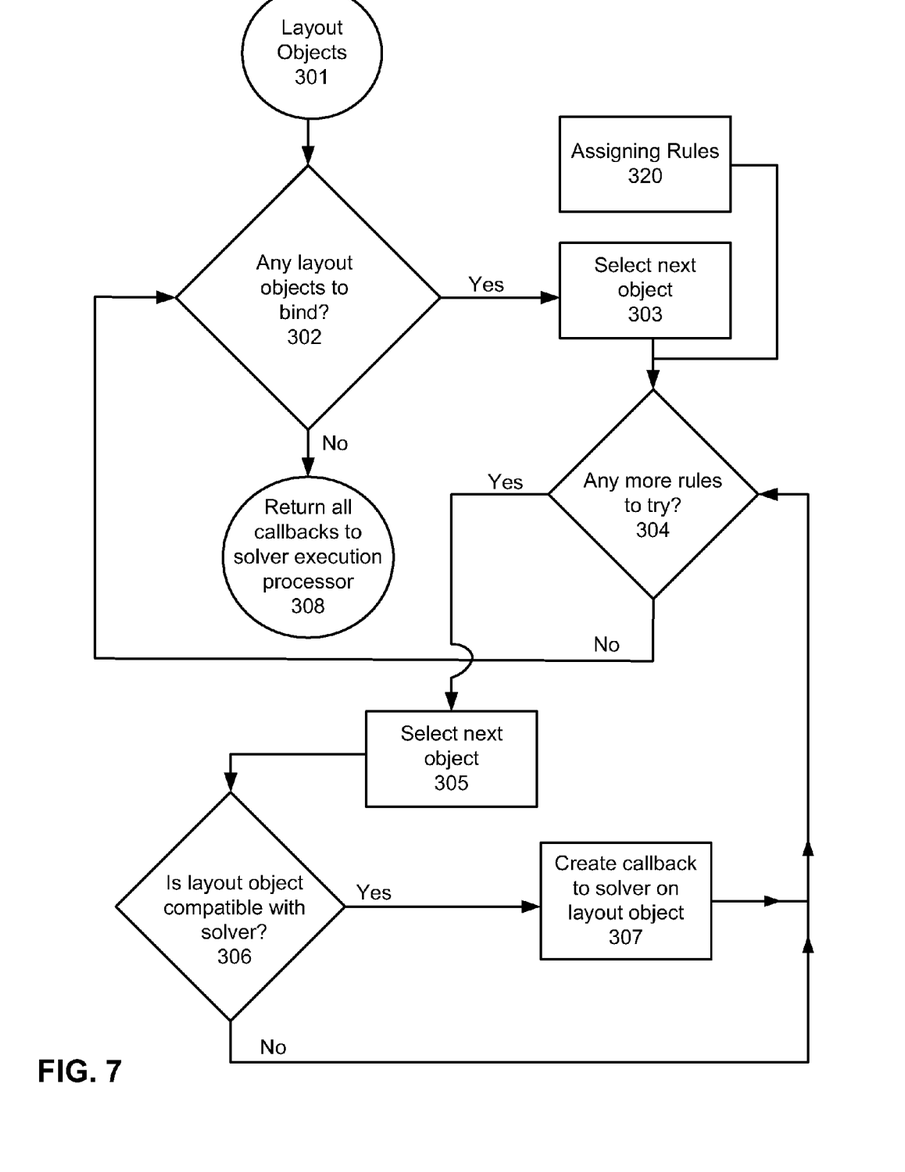
FIG. 7 shows an exemplary flow chart illustrating a process for binding layout objects to solvers according to an embodiment of the invention.

FIG. 7 shows an exemplary flow chart illustrating a process for binding layout objects to solvers according to an embodiment of the invention. Referring to FIG. 7, layout objects 301 extracted from physical data corresponding to a circuit, along with associated geometries previously extracted, are compared with all of the user-defined assigning rules 320. If the layout object is of a type compatible with a solver 306, then a callback to the solver for that layout object 307 is created for further use by the solver assigning process. For example, in an embodiment of the invention, if the layout object is a resistor array without any associated geometry, the object would be bound to all solvers which work upon integrated circuits in general and resistor arrays in particular, as well as to any general electromagnetic solvers for which an assigning rule exists. If, instead, the layout object is a series of wires in a star pattern, and the associated geometry is a star, the layout object is bound only to a specialized solver capable of solving star geometries, and any general electromagnetic solvers referenced for which an assigning rules exists.

The methods described above can be implemented on a computer system to automate the rule-based extraction of layout parasitics in a multi-technology environment. For example, the methods can be implemented as a computer program including a set of instructions written in a high level programming language executable on a computer or a computer system. The computer program can be provided in a computer readable medium that can be read by a computer or computer system to be loaded into an internal memory (e.g. RAM) of the computer or computer system. Then, one or more processor of the computer or computer system can execute the program loaded into the internal memory thereof to perform the tasks described in reference to the flow charts shown in FIGS. 2-7 above.

Figure 8:
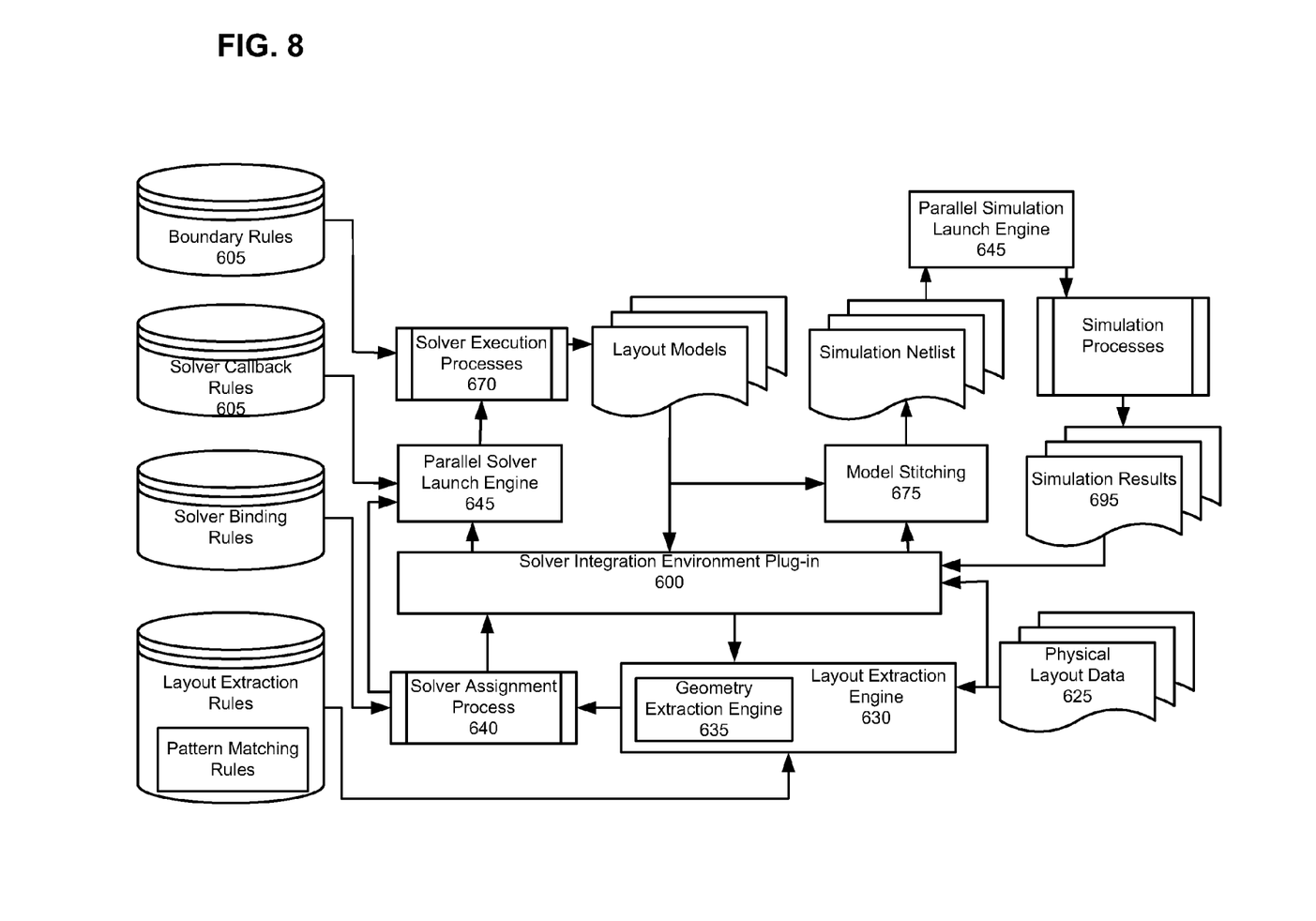
FIG. 8 shows a schematic of an exemplary system for extracting objects from a layout, binds the objects to solvers, and simulates the parasitic effects of combinations of the models created by the solvers in accordance with an embodiment of the invention.

FIG. 8 shows a schematic of an exemplary system for extracting objects from a layout, binds the objects to solvers, and simulates the parasitic effects of combinations of the models created by the solvers in accordance with an embodiment of the invention. The solver integration environment plug-in 600 controls the execution of the various functions of the apparatus. The solver integration environment plug-in 600 also provides an interface, e.g. a graphical user interface (GUI) allowing the user to maintain the user-defined rules by creating, deleting, or modifying any of the rules. The interface is provided by calling any database administration tool which has access to the database where the user-defined rules and patterns are maintained, such as commercial tools available from Oracle, Sybase, SQL Server, Microsoft, etc.

The user-defined rules include the layout extraction rules 615, the solver binding rules 610, and the solver callback rules 605. The layout extraction rules include the geometry extraction rules 635, including both entries containing callback functions and entries containing references to database entries of patterns. One or more the layout extraction rules 615, the solver binding rules 610, and the solver callback rules 605 can be stored on a storage area, e.g. a hard drive of the computer system or a network accessible storage for the computer system.

In an embodiment, the user-defined rules can be represented in a simple text file stored in the storage area of the computer system. In another embodiment, an xml file can also be generated to incorporate the user-defined rules. In yet another embodiment, the user-defined rules can be specified as callbacks to be executed at run-time, that is when the one or more processor of the computer or computer system executes the program loaded into the internal memory thereof to perform the tasks described in reference to the flow charts shown in FIGS. 2-7 above.

The solver integration environment plug-in 600 connects to the layout extraction engine, and can launch the process of extracting layout objects 630 and associated geometries 635 from physical layout data 625, using the user-define layout extraction rules 615 including geometry extraction rules and pattern matching rules 620. The layout extraction rules 615 includes a proximity rule 211, a cross-fabric rule 212, an extended net extraction rule 213, a via extraction rule 214, a technology pruning rule 215, a geometry extraction rule 216 stored in the storage area of the computer system. New layout extraction rules 615 may be added through the database interface provided by the plug-in 600 simply by adding an additional entry.

The solver integration environment plug-in 600 can be implemented as a software module residing on the computer system. In an embodiment, the solver integration environment plug-in 600 can invoke computer software modules implementing blocks 200, 300 and 400 from FIG. 2 above, respectively. Specifically, the computer module implementing block 200 includes a set of instructions which, when loaded into the internal memory of the computer system and executed by the computer system, causes the computer system to extract the physical data 100 based on the user-defined layout extraction rules 210 retrieved from the storage area of the computer system and provide the extracted layout objects, for example, in a shared memory area of the computer system for access by other computer program modules executed by the processors in the computer system.

Once layout objects are extracted, the solver integration environment plug-in 600 can automatically launch a solver assignment process 640 for binding layout objects to solvers using user-defined solver rules 610. The computer module implementing block 300 causes the computer system to bind the extracted layout objects retrieved from the shared memory area of the computer system to the corresponding solvers in accordance with the user-defined solver rules 610 retrieved from the storage area or loaded in the shared memory area of the computer system. These bindings are returned to the plug-in 600, for example, as output parameters from the returning callback routine, or in the shared memory area of the computer system.

New solvers designed to handle specialized elements can be added at any time simply by adding a solver binding rule 610 to the database indicating what types of objects the solver acts upon, and a solver callback rule 605 indicating how to launch the solver on objects of those types. A pattern matching rule 620 could also be entered for the solver to act upon objects with a specific geometry not recognized by the plug-in 600 by default, so that during layout extraction objects of that type are recognized as having that specific geometry.

The plug-in 600 is also connected to the solver scheduler 645, and as bindings are returned to the plug-in 600 they are furnished to the scheduler 645. In an embodiment, the solver scheduler 645 includes a computer module implementing block 400 of FIG. 2 above. The computer module implementing block 400 causes the computer system to launch solver execution processes 655 on the layout objects in accordance with the user-defined solver callback rules 605 stored in the storage area of the computer system or in a shared memory thereof. The models created by the solver execution processes 670 are returned to the plug-in 600, for example, as output parameters from the returning callback routine, or in the shared memory area of the computer system.

The plug-in 600 also connects to the simulation control engine 675. In an embodiment, the simulation control engine 675 includes a computer module implementing blocks 500 and 510 of FIG. 2 above. The computer module implementing blocks 500 and 510 causes the computer system stitches together the models of parasitic effects of the layout objects created by the solvers, and launches a test bench of user-defined simulations. The simulation results 695 are returned to the plug-in 600 for inspection, for example, as output parameters from the returning callback routine, or in the shared memory area of the computer system.

The solver integration environment plug-in 600, the layout extraction engine 630, the solver assignment process 640, the solver launch engine 645 and the solver execution process 670 can communicate with each other through a system bus if they are all on the same computer system or through an interconnection network, for example a local area network (LAN) or a wide area network (WAN), if any of the components are distributed geographically.

In another embodiment, the plug-in 600 also provides the ability to manually control or override various steps of the process, including the ability to manually bind a layout object to a solver, and the ability to manually select models of parasitic effects to send to a specific simulation agent.

It will be apparent to those skilled in the art that various modifications and variations can be made in embodiments of rule-based automatic layout parasitic extraction in a multi-technology environment without departing from the spirit or scope of the invention. Thus, it is intended that embodiments of the invention cover the modifications and variations of this invention provided they come within the scope of the appended claims and their equivalents.

What is claimed is:

1. A method for extracting a layout from an object in a fabric, the method comprising:
   providing, using one or more computing devices, fabric data to a rule-based layout extraction engine;
   selecting, using one or more computing devices, a layout object from the fabric data based upon a layout extraction rule;
   binding, using one or more computing devices, the layout object to a solver based upon a binding rule;
   specifying, using one or more computing devices, a boundary condition for a solver based upon a boundary rule;
   executing, using one or more computing devices, the solver on the layout object to generate a model of the object; and
   processing, using one or more computing devices, the model in a simulation environment to determine parasitic effects.

2. The method of claim 1, wherein the layout extraction rule includes a pattern matching rule to recognize a geometry associated with the layout object, and the binding rule binds the layout object and the associated geometry to a solver.

3. The method of claim 1, wherein executing the solver on the layout object to generate a model of the object includes a plurality of solvers generating models of a plurality of objects.

4. The method of claim 3, further comprising:
   prioritizing the execution of a plurality of solvers based upon an assigning rule.

5. The method of claim 1, further comprising:
   combining the model with a plurality of other models and processing the combination in a simulation environment to determine parasitic effects.

6. The method of claim 5, further comprising:
   comparing and selecting between simulations of parasitic effects of different combinations of models.

7. The method of claim 5, wherein the method automatically generates a plurality of combinations of models from a physical data set, simulates parasitic effects of the combinations, and chooses the combination with the desired parasitic effects.

8. A non-transitory computer program product that includes a computer readable medium, the computer readable medium comprising instructions which, when executed by a processor, causes the processor to execute a process for extracting a layout from an object in a fabric, the process comprising:
   providing fabric data to a rule-based layout extraction engine;
   selecting a layout object from the fabric data based upon a layout extraction rule;
   binding the layout object to a solver based upon a binding rule;
   specifying a boundary condition for a solver based upon a boundary rule;
   executing the solver on the layout object to generate a model of the object; and
   processing the model in a simulation environment to determine parasitic effects.

9. The computer program product of claim 8, wherein the layout extraction rule includes a pattern matching rule to recognize a geometry associated with the layout object, and the binding rule binds the layout object and the associated geometry to a solver.

10. The computer program product of claim 8, wherein executing the solver on the layout object to generate a model of the object includes a plurality of solvers generating models of a plurality of objects.

11. The computer program product of claim 10, further comprising:
    prioritizing the execution of a plurality of solvers based upon an assigning rule.

12. The computer program product of claim 8, further comprising combining the model with a plurality of other models and processing the combination in a simulation environment to determine parasitic effects.

13. The computer program product of claim 12, further comprising comparing and selecting between simulations of parasitic effects of different combinations of models.

14. The computer program product of claim 12, wherein the method automatically generates a plurality of combinations of models from a physical data set, simulates parasitic effects of the combinations, and chooses the combination with the desired parasitic effects.

15. A non-transitory computer readable medium storing a set of instructions which, when executed by a computer processing system, causes the computer processing system to process input data representing the layout of an electronic circuit to extract one or more object from the layout for binding with a corresponding binding solver, the set of instructions comprising:
    selecting a first object from the layout;
    applying at least one of a plurality of layout extraction rules relating the first object to a second object from the layout, the layout extraction rules including a proximity rule, a cross-fabric rule, an extended net rule, a via rule, a pruning rule, and a pattern matching rule;
    extracting the first and second objects from the layout in accordance with the applied layout extraction rule;

binding the extracted first and second objects to a solver in accordance with the applied layout extraction rule to generate a model of the interconnection between the first and second objects; and processing the model in a simulation environment to determine parasitic effects.

16. The computer readable medium of claim 15, wherein the set of instructions causes the computer processing system to apply the proximity rule to extract the first and second objects from the layout based on a range between the first and second objects.

17. The computer readable medium of claim 15, wherein the first object belongs to a first fabric of the layout, the second object belongs in a second fabric of the layout, and the set of instructions causes the computer processing system to apply the cross-fabric rule to extract the first and second objects from the layout based on a connection between the first and second objects across the first and second fabrics.

18. The computer readable medium of claim 15, wherein the first and second objects belongs to the same net and the set of instructions causes the computer processing system to apply the extended net rule to extract the first and second objects from the layout.

19. The computer readable medium of claim 15, wherein the set of instructions causes the computer processing system to apply the pruning rule to extract the first and second objects from the layout if the first and second objects belong to the same layer of the layout.

20. The computer readable medium of claim 15, wherein the set of instructions causes the computer processing system to apply the pattern matching rule to extract the first and second objects from the layout according to a geometric arrangement of the first and second objects in the layout.

* * * * *